(12) United States Patent
Soyez et al.

(10) Patent No.: US 8,092,029 B2
(45) Date of Patent: Jan. 10, 2012

(54) LENS MODULE COMPRISING AT LEAST ONE EXCHANGEABLE OPTICAL ELEMENT

(75) Inventors: Guido Soyez, Ludwigsburg (DE); Stephan Back, Langenau (DE); Joachim Buechele, Westhausen (DE); Julian Kaller, Koenigsbronn (DE); Guido Limbach, Aalen (DE); Harald Woelfle, Waldkirch (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 934 days.

(21) Appl. No.: 11/722,595

(22) PCT Filed: Dec. 23, 2005

(86) PCT No.: PCT/EP2005/013990
§ 371 (c)(1),
(2), (4) Date: Feb. 28, 2008

(87) PCT Pub. No.: WO2006/069755
PCT Pub. Date: Jul. 6, 2006

(65) Prior Publication Data
US 2008/0137192 A1 Jun. 12, 2008

Related U.S. Application Data

(60) Provisional application No. 60/639,684, filed on Dec. 23, 2004.

(51) Int. Cl.
*G02B 1/00* (2006.01)
(52) U.S. Cl. ...................................................... 359/507
(58) Field of Classification Search .................. 359/507, 359/819, 820
See application file for complete search history.

(56) References Cited

U.S. PATENT DOCUMENTS

| 7,061,698 B2 | 6/2006 | Osterried et al. |
| 2001/0026355 A1 | 10/2001 | Aoki et al. |
| 2001/0026402 A1* | 10/2001 | Gerhard et al. ............... 359/731 |

FOREIGN PATENT DOCUMENTS

| DE | 101 21 346 A1 | 11/2002 |
| JP | 2004071663 A | 3/2004 |
| WO | 01/73825 A1 | 10/2001 |
| WO | 0173825 A1 | 10/2001 |

* cited by examiner

*Primary Examiner* — Euncha Cherry
(74) *Attorney, Agent, or Firm* — Sughrue Mion, PLLC

(57) ABSTRACT

Disclosed is a lens module, especially a projection lens for semiconductor lithography, comprising at least one replaceable optical element that is disposed in a lens housing. At least one gas exchange device is positioned in an area of the replaceable optical element in such a way that a receiving zone for the replaceable optical element can be flushed when the optical element is replaced.

37 Claims, 7 Drawing Sheets

LENS MODULE COMPRISING AT LEAST ONE EXCHANGEABLE OPTICAL ELEMENT

CROSS REFERENCE TO RELATED APPLICATION

This application is a U.S. National Phase Entry Under 35 U.S.C. §371 of, and claims priority under 35 U.S.C. §§119 and 363 to copending PCT/EP2005/013990, filed Dec. 23, 2005 which designated the U.S. and which claims priority to U.S. Provisional Application No. 60/639,684, filed Dec. 23, 2004.

BACKGROUND OF THE INVENTION

1. Field of the Invention

The invention relates to a lens module comprising at least one exchangeable optical element. In this case, a lens module is understood as meaning part of a projection lens or an illuminating lens for semiconductor lithography or else the entire lens. The invention also relates to a method for flushing a receiving region of an optical element.

2. Description of the Related Art

In the case of high-performance lenses, as is the case for example with projection lenses in semiconductor lithography, imaging errors after an adjustment of the lens and during use of the lens must be minimized. To correct the imaging errors, an optical element that can be exchanged under operating conditions is therefore provided.

In addition, it is advantageous to provide exchangeable optical elements for using the same projection exposure machine to produce different types of semiconductor devices. On account of different structures (for example perpendicular and vertical lines, via holes, honeycomb structures), different semiconductor devices lead to different requirements for the type of exposure in the projection exposure machine, for example with regard to the numerical aperture or the type of illuminating field (for example annular, dipole, quadrupole). Possible means of realizing the desired properties are, for example, filters in or near the pupil plane, which screen spatial regions of the pupil, neutral filters, which have a constant transmission or a transmission that is variable over their surface, or polarizing elements.

In this case, the exchangeable optical elements referred to may be used both in the projection lens and in the illuminating system of a projection exposure machine.

However, there is the risk that freedom from contamination cannot be ensured in the lens module as a result of the fitting and removal of the exchangeable optical element, entailing the introduction of gas from the outside. This introduced gas may have the consequence that the optical elements in the lens module of the projection exposure machine are contaminated by (photo)chemical reaction. Furthermore, the introduced gas may impair the optical properties if it has a refractive index that is different from that of the flushing gas of the lens module.

The present invention is therefore based on the object of providing a lens module, in particular a projection lens for semiconductor lithography, with which no contamination is introduced after an optical element is exchanged and re-fitted, and rapid reuse is made possible.

SUMMARY OF THE INVENTION

This object is achieved according to the invention by at least one gas exchange device being arranged in a region of the exchangeable optical element in such a way that a receiving region for the exchangeable optical element can be flushed during the exchange of the optical element.

This means that, after the fitting of the new exchangeable optical element, the volume of gas in the lens module can be quickly exchanged and, as a result, further use of the lens module is possible without any problem after a short time.

The at least one gas exchange device according to the invention, by which the receiving region of the optical element is flushed during the exchange, i.e. in the opened state of the lens module, allows contamination in the interior of the lens module during the exchange of the optical element to be avoided, so that much less flushing time is necessary after the closing of the lens module. The consequently reduced downtime of the machine has the effect that an exchange of the optical element is more acceptable. The risk of internal contaminations during the exchange of the optical element on account of reduced effectiveness of the exchangeable optical element can be significantly reduced by the flushing according to the invention of the receiving region for the optical element.

An advantage of this solution is that the projection exposure machine can be optimized in a very short time for this respectively chosen application, so that the machine can also be operated with a high throughput in the case of small batches for a specific type of device.

It is particularly favorable if the aforementioned optimization is performed so quickly that an optimization can be carried out after each wafer. This enables the user to expose the same wafer twice directly in succession, for example with vertical and horizontal structures, without having to remove it from the wafer stage, which would significantly improve the accuracy of the spatial positioning of the two structures in relation to each other.

This procedure, known as double exposure, has previously only been used in conjunction with intermediate storage outside the wafer stage of the wafer exposed with one structure.

The proposed solution effectively reduces the risk of contamination by the two mechanisms described below: during the exchange of the optical elements, contaminations can diffuse into the lens module as a result of it being opened for a short time. This diffusion even takes place when the lens module is under increased pressure in comparison with ambient pressure. Moreover, the movement of the exchangeable optical element can cause gas to be introduced from the ambience by the effects of suction and turbulence.

Another way of introducing contamination is that of contamination adsorbed on the exchangeable element, in particular hydrocarbons, which may be deposited on it during storage.

In an advantageous way, it may be provided that the at least one gas exchange device is formed as a gas inlet device in such a way that a laminar gas stream is obtained, completely or virtually preventing inward diffusion of contaminations from the ambient air during the exchange of the optical element.

In an advantageous refinement, the at least one gas inlet device has a grating device with at least one grating, with preference two or more gratings, to produce the laminar gas stream.

A laminar gas stream has the effect of avoiding turbulences, and consequently effectively removing or keeping away from the interior of the lens module contaminations which could diffuse into the lens module during the exchange of the optical element.

In claim 15, a further solution of the aforementioned object is specified, a solution in which the optical element to be exchanged is kept in a gas lock; claim 22 relates to a solution in which the receiving region of the optical element is shielded from adjacent spaces by a gas seal.

In claim 24, a method according to the invention for flushing a receiving region of an optical element is specified.

Advantageous refinements and developments of the invention are provided by the remaining subclaims. Exemplary embodiments of the invention are explained in more detail below on the basis of the drawings.

DETAILED DESCRIPTION

Figure 1:
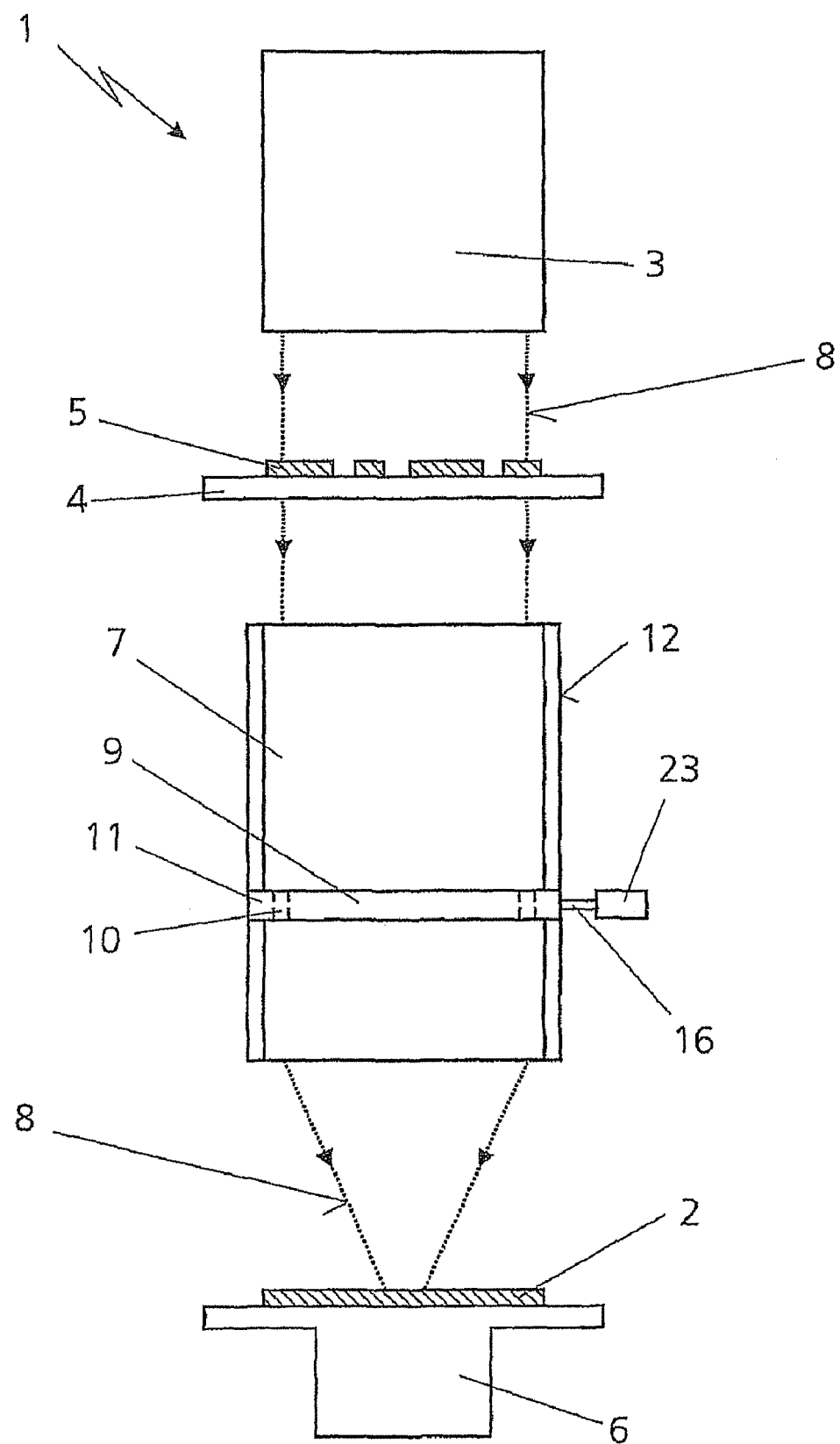
FIG. 1 shows a basic representation of a projection exposure machine for semiconductor lithography, which can be used for exposing structures on wafers coated with photosensitive materials.

In FIG. 1, a projection exposure machine 1 for semiconductor lithography is represented. This serves for exposing structures on a substrate which is coated with photosensitive materials, generally consists predominantly of silicon and is referred to as a wafer 2, for the production of semiconductor devices, such as for example computer chips.

The projection exposure machine 1 in this case substantially comprises an illuminating device 3, a device 4 for receiving and exactly positioning a mask provided with a grating-like structure, known as a reticle 5, by which the later structures on the wafer 2 are determined, a device 6 for securing, advancing and exactly positioning the wafer 2 and a projection lens 7.

The basic functional principle provides in this case that the structures introduced into the reticle 5 are exposed on the wafer 2, in particular with a reduction in the size of the structures to one third or less of the original size. The requirements to be imposed on the projection exposure machine 1, in particular on the projection lens 7, with regard to the resolution in this case lie in the range of just a few nanometers.

Once exposure of the wafer 2 has been performed, said wafer is advanced, so that a multiplicity of individual fields, each with the structure determined by the reticle 5, are exposed on the same wafer 2. When the entire area of the wafer 2 has been exposed, said wafer is removed from the projection exposure machine 1 and subjected to a plurality of chemical treatment steps, generally removing material by etching. If appropriate, a number of these exposure and treatment steps are passed through one after the other, until a multiplicity of computer chips are created on the wafer 2.

The illuminating device 3 provides a projection beam 8, for example light or similar electromagnetic radiation, required for the imaging of the reticle 5 on the wafer 2. A laser or the like may be used as the source of this radiation. The radiation is supplied to the illuminating device 3 by means of optical elements, so that the projection beam 8 has the desired properties with regard to diameter, polarization and the like when it impinges on the reticle 5. An image of the reticle 5 is produced by means of the projection beam 8 and is transmitted by the projection lens 7 in an appropriately reduced size onto the wafer 2, as already explained above. The projection lens 7 in this case comprises a multiplicity of individual refractive and/or diffractive elements, such as for example lenses, mirrors, prisms, end plates or the like.

Furthermore, in the projection lens 7, at least one optical element 9 which is formed as an exchangeable optical element is mounted in a mount 10. The optical element 9, here a lens, is arranged in the projection lens 7 in a pupil plane. The mount 10 with the optical element 9 is in turn mounted in a housing mount 11, which is part of a lens housing 12. In this case, the lens housing is part of the lens module or forms the lens module. The housing mount 11 in this case forms part of the outer circumference of the lens housing 12. Further such exchangeable optical elements may likewise be provided in the projection lens 7, the optical element 9 in the pupil plane being assumed hereafter.

Figure 2:
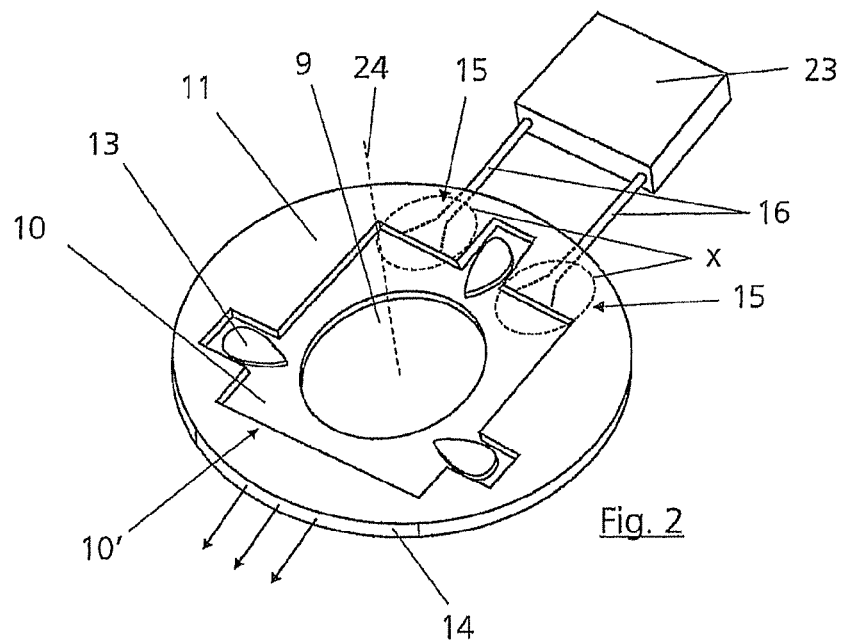
FIG. 2 shows a perspective basic diagram of a mount of a lens housing in which an exchangeable optical element is arranged.

In FIG. 2, the exchangeable optical element 9 is perspectively represented. The optical element 9, mounted in the projection lens 7 in a receiving region 10' provided for it, is connected to the mount 10 for example by means of small supporting feet. By pushing it into the housing mount 11 of the lens housing 12, the mount 10 is connected to the latter by means of three fastening elements 13. The housing mount 11 of the lens housing 12 comprises a ring, in particular a steel ring, in which a push-in opening 14 is made for the insertion of the mount 10 with the optical element 9. The push-in opening 14 is made, in particular milled, in the housing mount 11 of the lens housing 12, in order in this way to ensure simple exchange of the optical element 9. The fastening elements 13 may be formed as adjustable fastening elements, for example as manipulators, in order to mount the mount 10 with the optical element 9 exactly and centered in the housing mount 11 of the lens housing 12.

Figure 3:
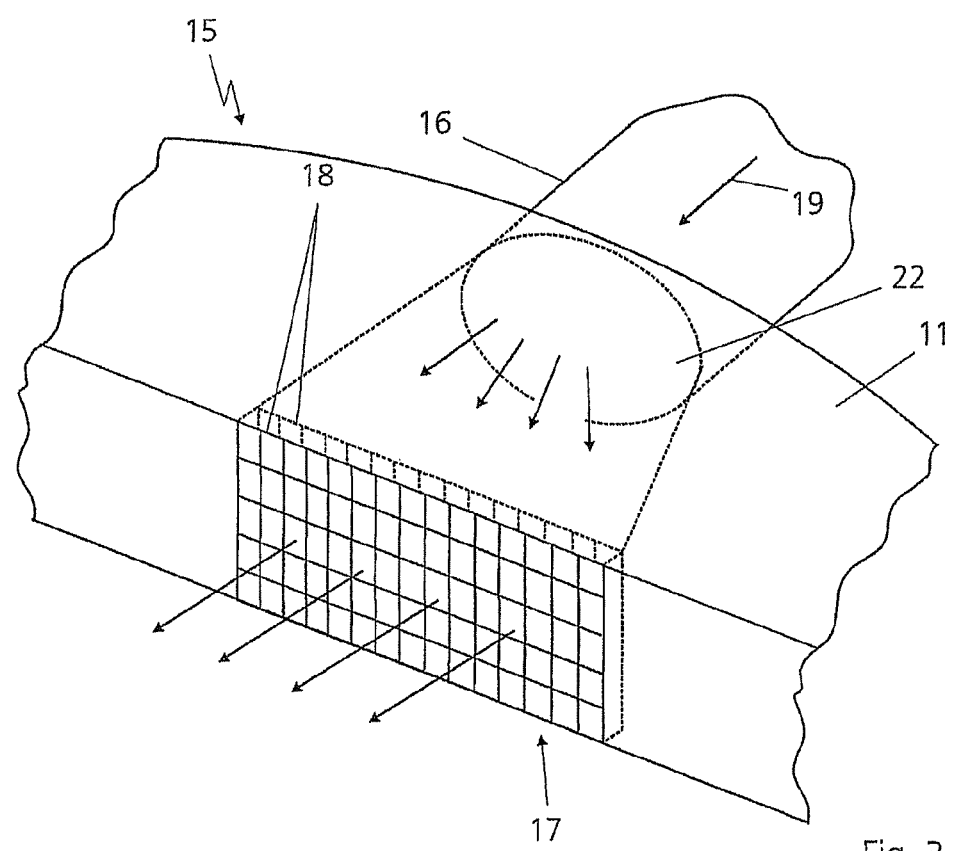
FIG. 3 shows a perspective representation of a gas inlet device according to the invention.

Provided in a region opposite the push-in opening 14 for the optical element 9 are two gas inlet devices 15, which are respectively provided to the side of a fastening element 13. In FIG. 3, one of the two gas inlet devices 15 is represented in more detail in an enlarged form. The regions in which a gas inlet device 15 is respectively arranged in the housing mount 11 of the lens housing 12 are identified in FIG. 2 by an "X". During the exchange of the mount 10 together with the optical element 9, the mount 10 and the optical element 9 being removed from the housing mount 11 of the lens housing 12 by way of the push-in opening 14, a gas stream is supplied by way of at least one gas inlet line 16 to the gas inlet devices 15, which produce a laminar gas stream, a gas inlet line 16 for each gas inlet device 15 being represented in FIG. 2. The gas stream introduced into the gas inlet devices 15 from outside the projection lens 7 is supplied to the gas inlet devices 15 by a gas supply device 23 by way of the gas inlet lines 16. The laminar gas stream represented by the arrows is conducted in the direction of the push-in opening 14, whereby a flushing of the receiving region 10' of the mount 10 is performed, and so contaminations in the interior of the projection lens 7 are avoided during the exchange of the mount 10. Once the mount 10 with the optical element 9 has been secured again on the fastening elements 13, the laminar flow, which flows perpendicularly in relation to an optical axis 24 through the receiving region 10', and consequently transversely through the interior of the lens housing 12, and leaves at the push-in opening 14, can be ended or switched off.

The gas inlet device 15 represented in FIG. 3 has a grating device 17 at the inlet into the receiving region 10'. Said grating device is provided with a number of gratings 18 one behind the other and offset in relation to one another, which are only indicated here, in order to produce a laminar gas stream. In order to produce a laminar gas stream, generally at least three gratings 18 should be provided, as shown by the basic representation in FIG. 3. However, it is self-evidently also possible to provide only one grating 18 in the grating device 17, if at least one largely laminar gas stream can be ensured with it.

Furthermore, FIG. 3 shows the gas inlet line 16 for introducing the gas stream, which is represented here by an arrow 19. Either high-purity nitrogen or noble gas or gas mixtures of such inert gases as nitrogen or noble gases may be used as the gas; the same gas that is already used in the interior of the projection lens 7 for flushing the same should advantageously be used. The gas pressure of the gas stream that is used should be regulated in such a way that a laminar gas stream is ensured. In order to conduct the gas stream from the gas inlet line 16 appropriately to the grating device 17, at least one cross-bore 22 is provided in the housing mount 11 of the lens housing 12.

Figure 4:
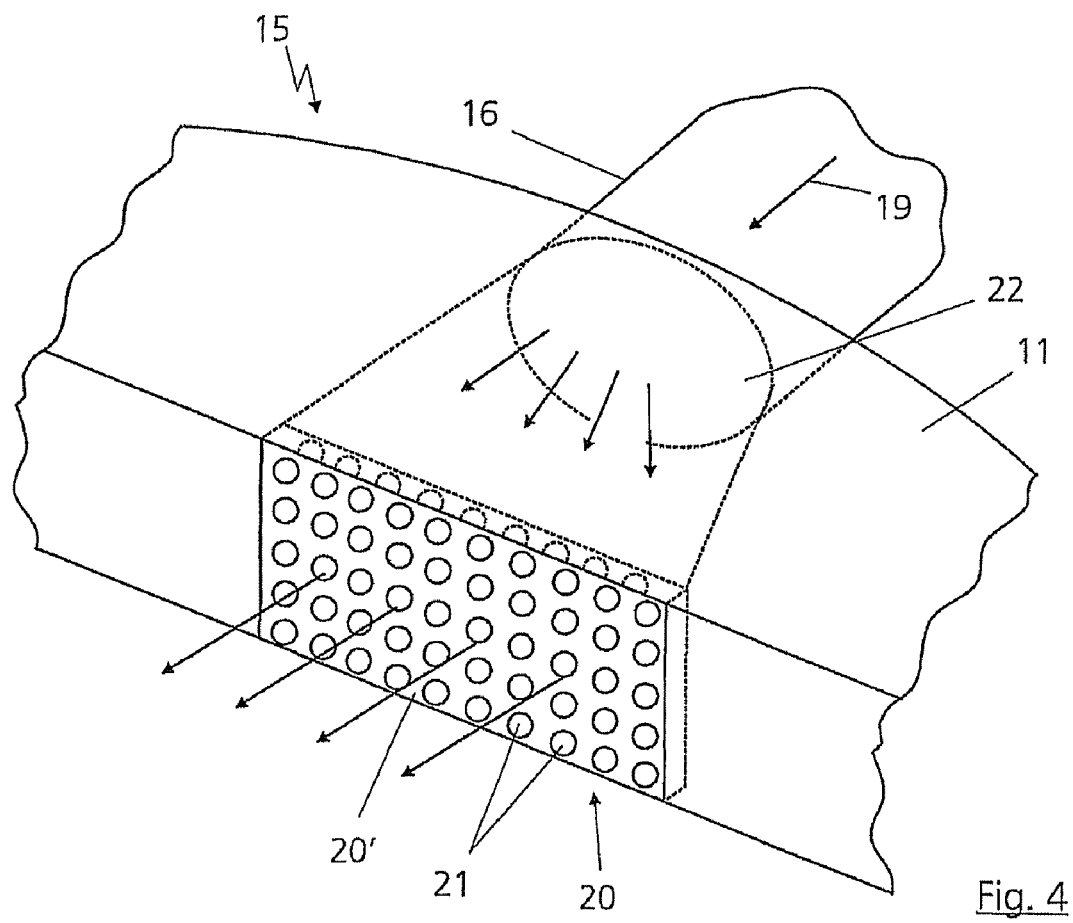
FIG. 4 shows a perspective representation of an alternative gas inlet device according to the invention.

Alternatively, instead of the grating device 17 with one or more gratings 18, a bore device 20 with a multiplicity of bores 21 may be provided in a plate at the end of the bore 22 in the housing mount 11, in front of the outlet in the receiving region 10', FIG. 4 showing said plurality of bores arranged in a plate 20'. Since only the grating device 17 has been replaced by the bore device 20, and otherwise the same parts as in FIG. 3 are provided, the same designations have also been used. The bore device 20 may also have a number of bores 21 one behind the other and offset in relation to one another, which are arranged in plates 20' arranged at a distance from one another.

Figure 5:
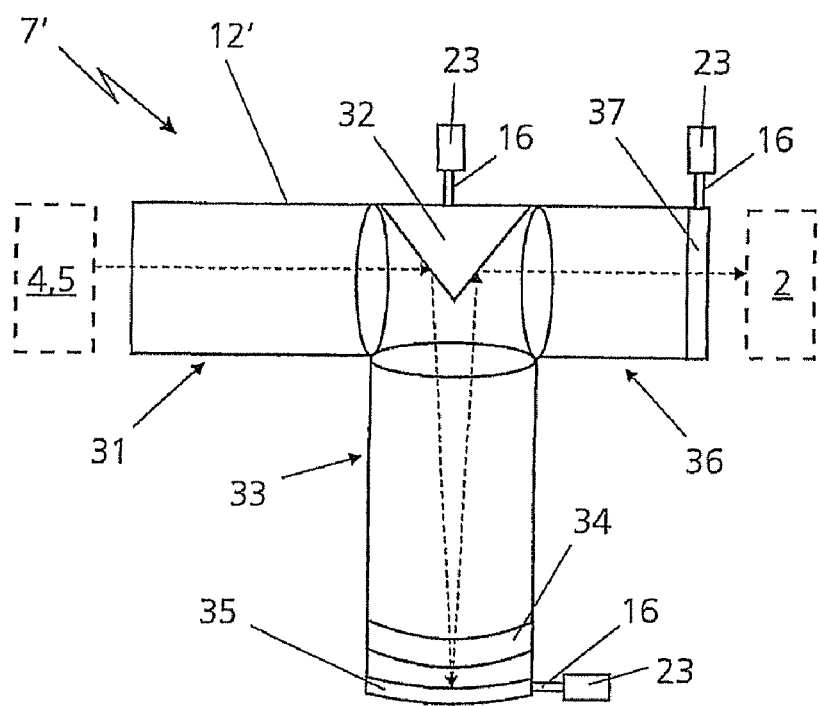
FIG. 5 shows a basic representation of a lens module with a number of exchangeable optical elements for a further projection exposure machine.

In FIG. 5, a projection lens 7' with a lens housing 12' for a further embodiment of the projection exposure machine 1 is represented in a greatly simplified form. The device 4 for receiving and exactly positioning the reticle 5 and the wafer 2 are indicated by dashed lines. The projection lens 7' has, beginning at the reticle 5 and proceeding in the radiating direction, a refractive part 31, an exchangeable deflecting prism 32, a catadioptric part 33 with a lens 34 and an exchangeable concave deflecting mirror 35 as well as a further refractive part 36 with an exchangeable end element 37. In the region of the exchangeable optical elements, i.e. the deflecting prism 32, the concave deflecting mirror 35 and the end element 37, gas inlet devices with gas supply devices 23 and gas inlet lines 16 are arranged in the housing mount (not represented in any more detail), whereby it is possible during the exchange of the optical elements 32, 35 and 37 for their receiving regions (not represented in detail in FIG. 5) to be flushed.

Figure 6:
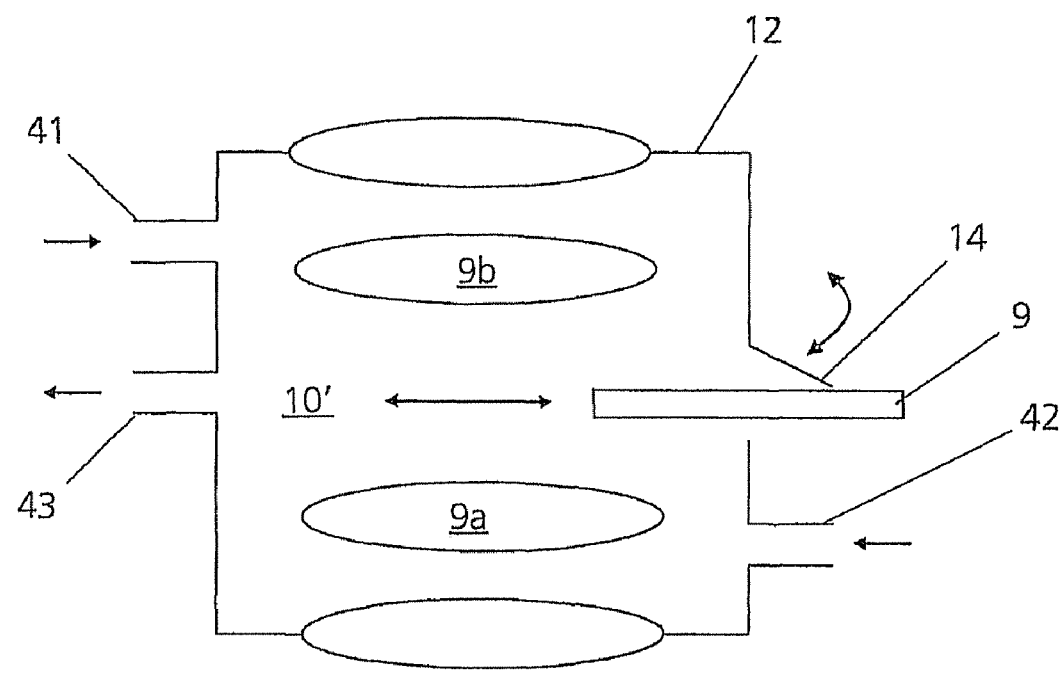
FIG. 6 shows a basic representation of a lens module with a gas outlet device in a region of the lens housing that lies opposite a push-in opening for the optical element.

In a preferred way, the gas in the inner space of the lens housing 12 is conducted in such a way that, during the exchange, it flows away through the push-in opening 14, as represented in FIG. 6. In the embodiment represented, the exchangeable element 9 is at the center of a lens housing 12, between at least two further optical elements 9a and 9b. By contrast with a solution in which a gas inlet device is located at one end of the lens housing or the lens module and a gas outlet device is located at the other end, with preference a gas inlet device 41 or 42 is respectively provided at both ends and a gas outlet device 43 is provided in the receiving region 10', which accommodates the element 9 to be exchanged. This described arrangement of the gas inlet and outlet devices achieves the effect that penetrating contamination is effectively removed from the inner space of the lens housing 12.

Figure 7:
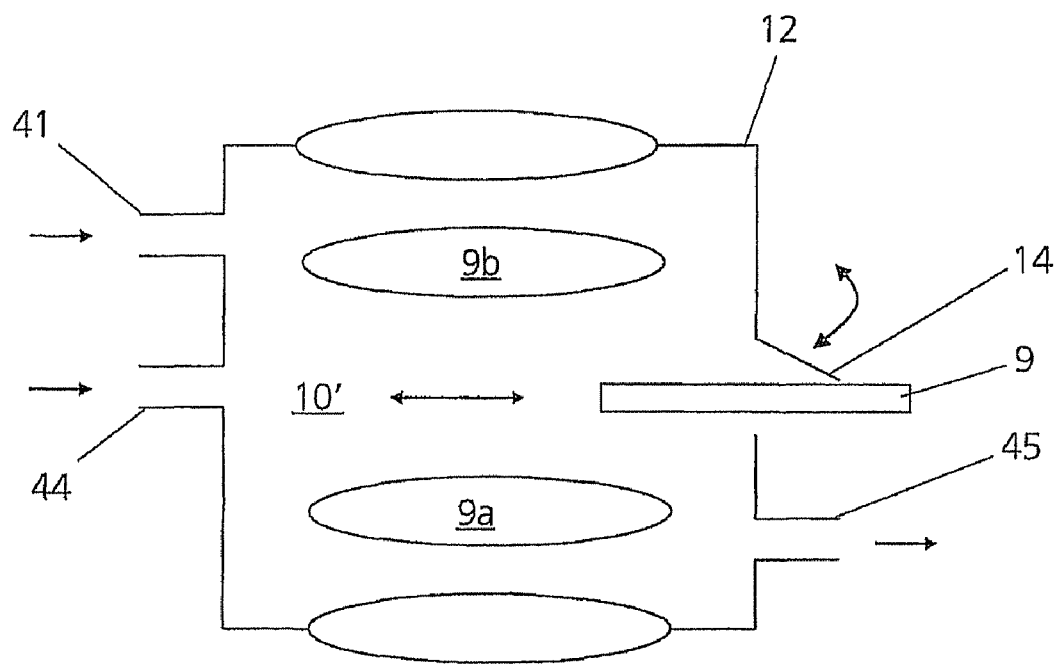
FIG. 7 shows a basic representation of a lens module with a further gas inlet device on the side of the housing mount opposite the push-in opening.

In a further advantageous embodiment, which is represented in FIG. 7, a further gas inlet device 44 is located in the receiving region 10', which accommodates the element 9 to be exchanged. On the side of the lens housing 12 that is facing the push-in opening 14 there is a gas outlet device 45. It is advantageous in particular in the case of this embodiment that, on account of the arrangement of the gas inlet and outlet devices, a virtually laminar flow in the direction of the push-in opening 14 can form in the interior of the lens housing 12, allowing contaminations to be efficiently removed from the lens housing 12.

Figure 8:
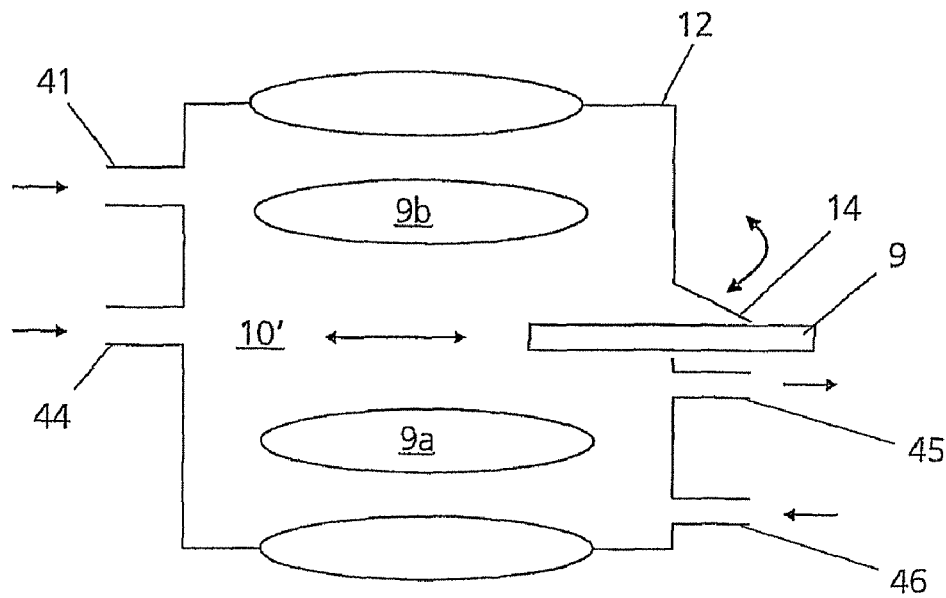
FIG. 8 shows a basic representation of a lens module with a further gas inlet device on the side of the push-in opening in the housing mount.

Combination of the two embodiments represented in FIGS. 6 and 7 produces the solution described in FIG. 8. In addition to the gas inlet device 44, a further gas inlet device 46 is present in the vicinity of the receiving region 10', on the side facing the push-in opening. In this way, further significantly increased flushing through of the receiving region 10' is ensured.

A slight positive pressure of 50 to 1000 Pa in relation to the ambience usually prevails in the inner space of the lens housing 12. If an opening is then created to exchange the exchangeable element 9, this positive pressure breaks down virtually completely, unless the gas supply is designed for a short-term delivery of extreme amounts of gas. However, this would lead to undesired side effects, such as for example a drop in pressure in the lines. For example, with a positive pressure of 100 Pa, 4500 l/min of flushing gas would flow through an opening of 100×2 mm in a 5 mm thick housing wall.

Figure 9:
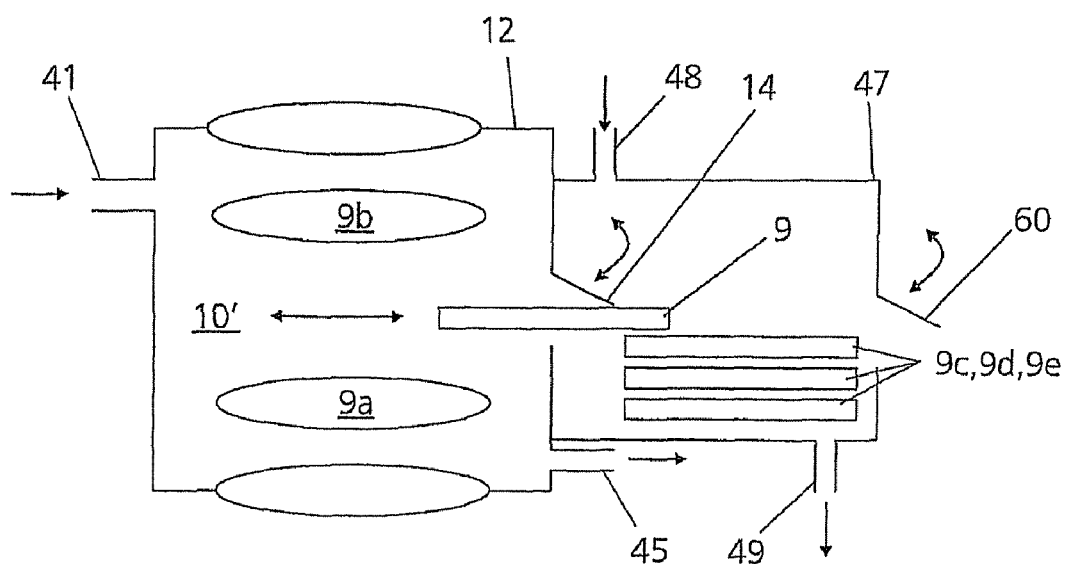
FIG. 9 shows a basic representation of a lens module with a gas lock for keeping the optical element.

This drop in pressure must be equalized again in as short a time as possible after introduction of the exchangeable element 9. This can take place by the following advantageous possibilities:

FIG. 9: the exchangeable optical element 9 is brought into a gas lock 47, in which there prevails a pressure that is greater than the ambient pressure but less than or equal to the desired positive pressure in the lens housing 12. It is introduced into the gas lock 47 through the lock opening 60 and, from there, is introduced into the lens housing 12 through the push-in opening 14. Optionally, a number of exchangeable elements 9c, 9d, 9e may be stored in the gas lock 47. With preference, the gas lock 47 is flushed with the same gas as the lens housing 12 and has its own gas inlet device 48 and a gas outlet device 49.

Figure 10:
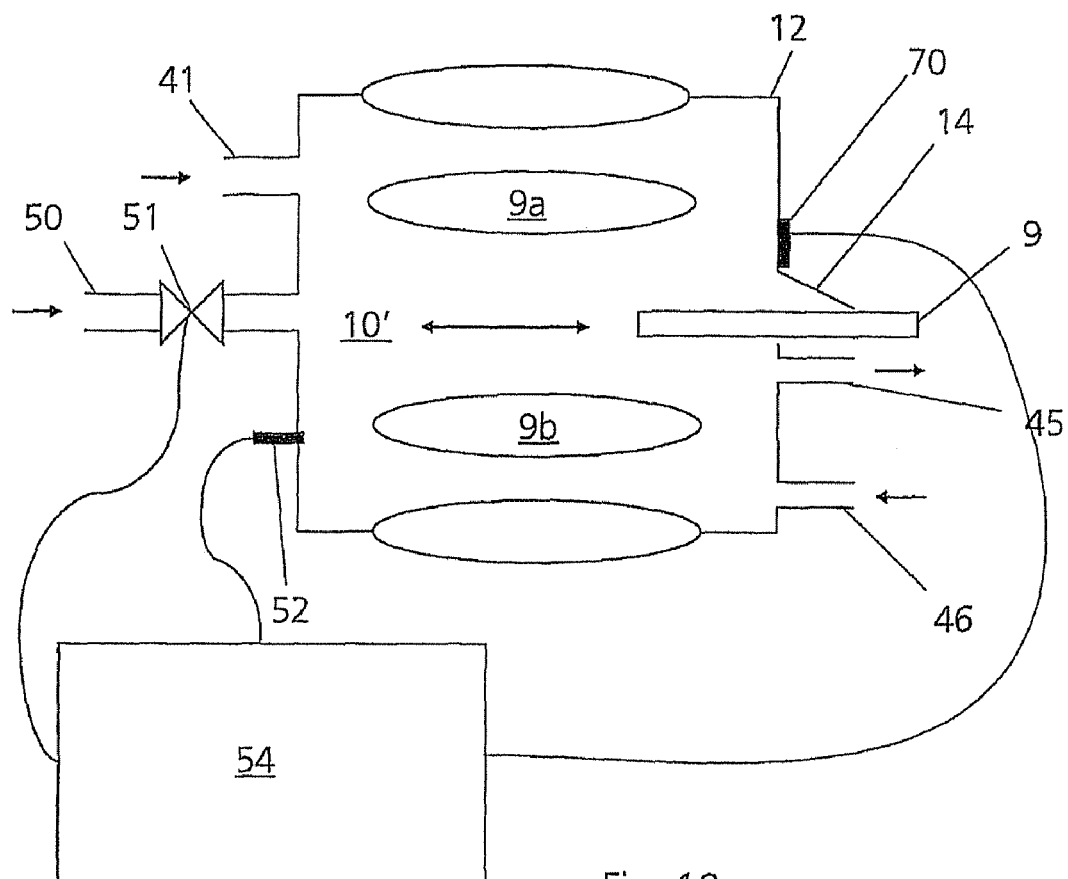
FIG. 10 shows a basic representation of a lens module with a gas inlet device with a valve which can be activated by means of a control device.

Another embodiment is represented in FIG. 10. It is based on the idea of equalizing the pressure loss independently of the gas supply of the lens housing by way of the gas inlet device 41 through an additional gas inlet device 50, which is opened for the time required to equalize the drop in pressure by a valve 51 actuated by means of a control device 54. The control may take place in a time-controlled manner, for example starting after a detection of the closing of the motor-operated push-in opening 14 by means of a closing sensor 70 connected to the control device 54, or take place in a pressure-controlled manner by means of a pressure sensor 52.

Any other gas inlet device may also serve as the gas inlet device for the gas supply; similarly, it is conceivable to close a gas outlet device during a changing operation.

In a particularly favorable embodiment, this additional gas stream is introduced into the receiving region 10' and switched on at the same time as or in temporal correlation with the motorized actuation of the push-in opening 14 in the lens housing 12. As a result, the receiving region 10' is continuously flushed in the direction of the exchange opening during the changing operation. Since the gas flow is only required for the duration of the exchange, the gas flow can be a multiple of the gas flow conventionally used for flushing the lens housing 12. In this case, it is advantageous if 95%, with preference 99%, of the positive operating pressure is achieved in the lens housing within 5 min, with preference within 30 s, after the change of the optical element, in particular after the closing of the push-in opening 14.

Figure 11:
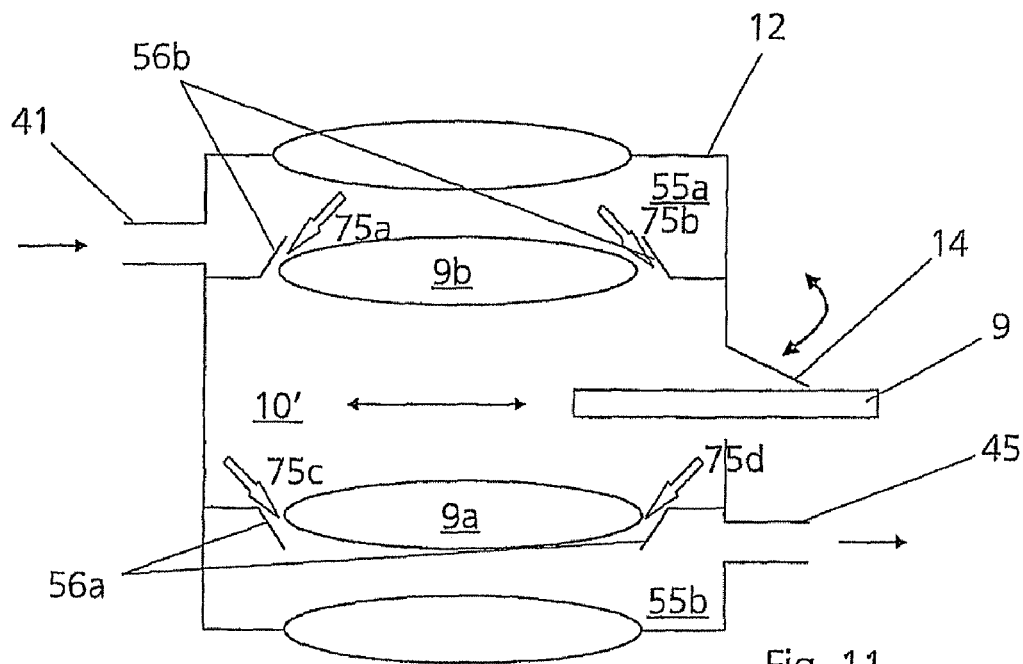
FIG. 11 shows a basic representation of a lens module, the inner space of the lens housing being designed in such a way that contamination from the receiving region into adjacent spaces in the lens housing is largely suppressed.

FIG. 11 shows a solution by which the inward diffusion of contamination from the receiving region 10' into adjacent gas spaces 55a and 55b can be restricted. Even if a higher pressure prevails in the adjacent gas spaces 55a, 55b than in the receiving region 10', contamination can penetrate into them by diffusion.

For this diffusion, the following formula applies:

$$C = C_0 \cdot \frac{1}{e^{\frac{u \cdot L}{D}} - 1}$$

where
u=flow velocity of the gas in the gap
L=length of the gap in the direction of flow
D=diffusion coefficient of the gas
C=here concentration in the gas space 55a
$C_0$=here concentration in the receiving region 10'

According to the invention, the contamination of the adjacent gas spaces 55a, 55b is restricted by the gap between the adjacent gas spaces 55a, 55b and the receiving region 10' being provided with a suitable geometry. For example, a peripheral gas seal 56a, 56b may be realized between the optical elements 9a, 9b and the inner wall of the lens housing 12. In this case, a gas seal is understood as meaning an at least partially open sealing gap in which a sealing effect is achieved with respect to the ambience by an opposing gas stream.

In FIG. 11, the preferred direction of flow of the flushing gas is indicated by the arrows 75a,b,c,d.

Preferred here for $H_2O$ as the contamination and $N_2$ as the flushing gas is a combination of gap length and flow velocity with contamination suppression=concentration of a gas in the gas space 55a/concentration of a gas in the receiving region 10' of >10, with preference >1000.

Figure 12:
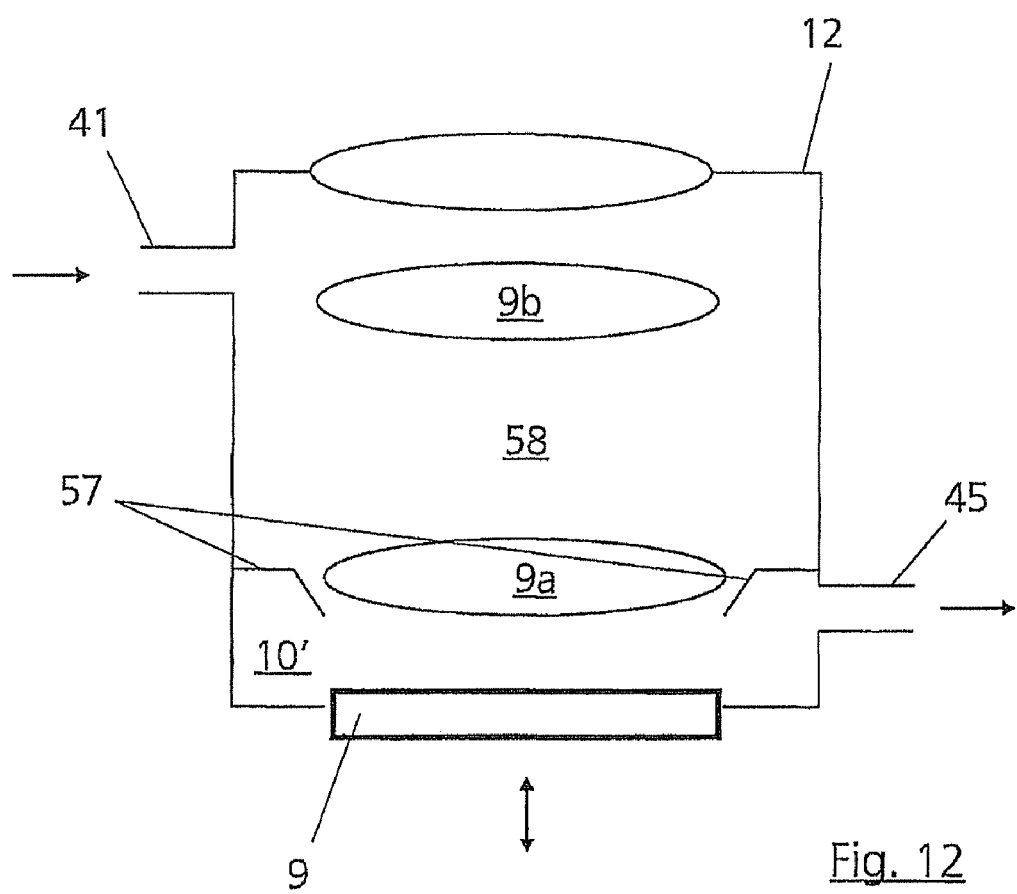
FIG. 12 shows an alternative arrangement of the element to be exchanged in the lens module.

The embodiments referred to have been shown for an element 9 located at the center, but can also be used if the exchangeable element 9 is located at the end of a lens housing 12, such as for example the last optical element of a projection lens (cf. FIG. 12), which in the present example is represented as a plane-parallel plate. The region of the plane-parallel plate is in this case separated from the adjoining gas space 58 by the gas seal 57.

The exemplary embodiments described merely represent forms of realization that are given by way of example. It is self-evident that further variants of the invention, in particular including combinations of the exemplary embodiments or individual features of the exemplary embodiments, are also conceivable.

What is claimed is:

1. A lens module, comprising:
   a lens housing;
   at least one optical element exchangeably arranged in a receiving region of the lens housing; and
   at least one gas exchange device arranged in a region of the exchangeable optical element and configured to flush the receiving region for the exchangeable optical element during an exchange of the optical element.

2. A lens module as claimed in claim 1, wherein the lens housing comprises a housing mount in which the at least one gas exchange device is arranged.

3. A lens module as claimed in claim 1, wherein the at least one gas exchange device comprises a gas inlet device configured and arranged to produce a laminar gas stream.

4. A lens module as claimed in claim 2, wherein the at least one gas exchange device is arranged in a region of the housing mount that lies opposite a push-in opening for the exchangeable optical element.

5. A lens module as claimed in claim 4, wherein the at least one gas exchange device comprises a gas inlet device, and wherein a further gas inlet device is arranged on a side of the lens housing opposite the push-in opening.

6. A lens module as claimed in claim 4 or 5, wherein an additional gas inlet device is arranged on a side of the push-in opening in the lens housing.

7. A lens module as claimed in claim 4 or 5, wherein the housing mount comprises at least one cross-bore, which is connected to a gas inlet line.

8. A lens module as claimed in claim 7, wherein the at least one gas exchange device comprises a gas inlet device having a grating device with at least one grating, which is arranged at an end of the cross-bore, in front of an outlet in the receiving region.

9. A lens module as claimed in claim 8, wherein the grating device has at least two gratings, configured and arranged to produce a laminar gas stream.

10. A lens module as claimed in claim 7, wherein the at least one gas exchange device comprises a gas inlet device having a bore device with a multiplicity of bores arranged at least in one plate, the bore device being arranged at an end of the cross-bore, in front of an outlet in the receiving region.

11. A lens module as claimed in claim 10, wherein the bore device has at least two plates with bores, configured and arranged one behind the other, to produce a laminar gas stream.

12. A lens module as claimed in claim 9, wherein the gratings are offset in relation to one another.

13. A lens module as claimed in claim 1, wherein the exchangeable optical element is arranged in a pupil plane.

14. A lens module as claimed in claim 2, wherein at least one gas outlet device is arranged in a region of the lens housing that lies opposite a push-in opening for the exchangeable optical element.

15. A lens module, comprising:
   a lens housing;
   at least one optical element exchangeably arranged in an inner space of the lens housing;
   a gas lock configured to receive the at least one optical element; and a push-in opening interconnecting the gas lock and the inner space of the lens housing, and configured to accommodate passage of the optical element between the gas lock and the lens housing.

16. A lens module as claimed in claim 15, wherein the gas lock comprises at least one gas inlet device.

17. A lens module as claimed in claim 15, wherein the gas lock comprises at least one gas outlet device.

18. A lens module as claimed in claim 15, wherein the gas lock has a lower pressure than the inner space of the lens housing and a higher pressure than an ambient environment of the lens module.

19. A lens module as claimed in claim 1, wherein the at least one gas exchange device comprises at least one gas inlet device provided with a valve activated by a control device.

20. A lens module as claimed in claim 19, wherein the control device is in connection with a pressure sensor configured to measure pressure in the receiving region of the lens housing.

21. A lens module as claimed in claim 19, wherein the control device is in connection with a push-in opening for the exchangeable optical element.

22. A lens module, comprising:
a lens housing;
at least one optical element;
a gas stream source; and
at least one gas seal,
wherein the lens housing and the optical element are configured to arrange the optical element selectively in the lens housing or entirely outside the lens housing,
wherein the lens housing has an inner space including a region of the optical element and a remaining inner space of the lens housing separated from the region of the optical element by the at least one gas seal, and
wherein the lens housing, the gas stream source, and the gas seal are configured to produce a predetermined, pressure-differential-induced gas stream between the region and the remaining inner space at least when the optical element is arranged in the lens housing.

23. A lens module as claimed in claim 22, wherein the gas seal is configured with a gap length and a flow velocity such that a contamination suppression ratio of greater than ten results, with $H_2O$ as the contamination and $N_2$ as flushing gas.

24. A method, comprising:
exchanging an optical element arranged in a lens housing; and
during the exchanging, flushing a receiving region of the optical element in the lens housing with a gas.

25. A method as claimed in claim 24, wherein the receiving region of the optical element is flushed with a laminar gas stream.

26. A method as claimed in claim 24 or 25, wherein:
the exchanging is via a push-in opening for the optical element, and
the flushing of the receiving region is with a gas stream which flows in from at least one gas inlet device and flows into the receiving region from a region that lies opposite the push-in opening for the optical element.

27. A method as claimed in one of claims 24 or 25, wherein the flushing of the receiving region is with a gas stream which runs perpendicularly in relation to an optical axis of the optical element.

28. A method as claimed in claim 24, wherein:
the exchanging is via a push-in opening for the optical element, and
the flushing of the receiving region is with a gas stream through the push-in opening and is increased in temporal correlation with the exchanging of the optical element.

29. A method as claimed in claim 28, wherein the increase in the gas stream through the push-in opening comprises switching on a gas inlet device of the lens housing.

30. A method as claimed in claim 28, wherein the increase in the gas stream through the push-in opening comprises increasing a rate of introducing the gas through a gas inlet device of the lens housing.

31. A method as claimed in claim 28, wherein the increase in the gas stream through the push-in opening comprises reducing the gas stream through a gas outlet device of the lens housing.

32. A method as claimed in claim 28, wherein the increase in the gas stream is initiated by a drop in pressure in the receiving region in the lens housing during the exchanging of the optical element.

33. A method as claimed in claim 28, wherein the flushing comprises influencing the gas stream by an opening state of the push-in opening during the exchanging of the optical element.

34. A method as claimed in claim 28, further comprising providing at least 95% of a predetermined operating pressure in the lens housing within thirty seconds of completion of the exchanging of the optical element.

35. A lens module as claimed in claim 22, wherein the gas seal is configured with a gap length and a flow velocity such that a contamination suppression ratio of greater than 1000 results, with $H_2O$ as the contamination and $N_2$ as flushing gas.

36. A lens module as claimed in claim 1, configured as a projection lens for semiconductor lithography.

37. A lens module as claimed in claim 11, wherein the plates with bores arranged one behind the other are offset in relation to one another.

* * * * *